(12) United States Patent
Tanaka et al.

(10) Patent No.: US 12,382,727 B2
(45) Date of Patent: Aug. 5, 2025

(54) SEMICONDUCTOR CHIP, SEMICONDUCTOR DEVICE AND MANUFACTURING METHOD OF SEMICONDUCTOR DEVICE

(71) Applicant: Renesas Electronics Corporation, Tokyo (JP)

(72) Inventors: Yoshito Tanaka, Tokyo (JP); Hideaki Hashimoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 18/443,779

(22) Filed: Feb. 16, 2024

(65) Prior Publication Data

US 2024/0194665 A1    Jun. 13, 2024

Related U.S. Application Data

(62) Division of application No. 17/097,870, filed on Nov. 13, 2020, now Pat. No. 11,942,471.

(51) Int. Cl.
*H10D 89/00*     (2025.01)
*H01L 21/66*     (2006.01)
(Continued)

(52) U.S. Cl.
CPC ........... *H10D 89/611* (2025.01); *H01L 22/20* (2013.01); *H10D 89/921* (2025.01); *H10D 84/0109* (2025.01); *H10D 84/038* (2025.01)

(58) Field of Classification Search
None
See application file for complete search history.

(56) References Cited

U.S. PATENT DOCUMENTS

| 5,381,105 A | 1/1995 | Phipps |
| 7,414,867 B2 | 8/2008 | Hussein et al. |

(Continued)

FOREIGN PATENT DOCUMENTS

| JP | H11-154746 A | 6/1999 |
| JP | 2001-308329 A | 11/2001 |

(Continued)

OTHER PUBLICATIONS

Extended European Search Report issued in corresponding European Patent Application No. 21206189.9-1230, dated Apr. 5, 2022.

(Continued)

*Primary Examiner* — Bilkis Jahan
(74) *Attorney, Agent, or Firm* — Rimon P.C.

(57) ABSTRACT

A semiconductor chip includes a first electrode connected to a gate of a power device, a second electrode connected to an emitter or a source of the power device, a third electrode, and a gate protection element. The gate protection element includes a first node and a second node, and a plurality of stages of p-n junctions formed between the first node and the second node. When one of the first electrode and the second electrode is a target electrode and the other is a non-target electrode, and the first node is connected to the third electrode and the second node is connected to the target electrode. Then, the first electrode, the second electrode, the third electrode and the gate protection element are formed in the same semiconductor chip.

1 Claim, 13 Drawing Sheets

(51) Int. Cl.
    *H10D 89/60* (2025.01)
    *H10D 84/01* (2025.01)
    *H10D 84/03* (2025.01)

(56) References Cited

U.S. PATENT DOCUMENTS

| | | | |
|---|---|---|---|
| 8,427,235 | B2 | 4/2013 | Williams |
| 2002/0008485 | A1 | 1/2002 | Yabe |
| 2002/0088991 | A1* | 7/2002 | Hisamoto ............ H01L 29/7813 |
| | | | 257/106 |
| 2005/0122748 | A1 | 6/2005 | Tadokoro et al. |
| 2008/0117557 | A1 | 5/2008 | Mamitsu |
| 2008/0252372 | A1 | 10/2008 | Williams |
| 2008/0258224 | A1* | 10/2008 | Hshieh ................ H10D 89/611 |
| | | | 438/237 |
| 2009/0102493 | A1 | 4/2009 | Disney et al. |
| 2009/0212321 | A1* | 8/2009 | Hsieh .................. H10D 12/481 |
| | | | 438/138 |
| 2010/0289059 | A1* | 11/2010 | Hsieh .................. H10D 12/481 |
| | | | 257/334 |
| 2010/0314681 | A1* | 12/2010 | Hsieh .................. H10D 84/148 |
| | | | 257/334 |
| 2011/0180844 | A1* | 7/2011 | Hsieh ...................... H01L 24/05 |
| | | | 257/E29.198 |
| 2011/0266593 | A1* | 11/2011 | Hsieh ................... H10D 89/611 |
| | | | 257/E29.262 |
| 2012/0049187 | A1 | 3/2012 | Haruyama et al. |
| 2013/0075810 | A1* | 3/2013 | Hsieh ................... H10D 89/611 |
| | | | 257/328 |
| 2013/0092976 | A1* | 4/2013 | Hsieh ................... H10D 30/668 |
| | | | 257/133 |
| 2014/0346635 | A1 | 11/2014 | Kawahara et al. |
| 2017/0278837 | A1 | 9/2017 | Hsieh |
| 2018/0166436 | A1 | 6/2018 | Sato |
| 2019/0288677 | A1 | 9/2019 | Yoshida |

FOREIGN PATENT DOCUMENTS

| | | |
|---|---|---|
| JP | 2005-175054 A | 6/2005 |
| JP | 2008-153615 A | 7/2008 |
| JP | 2012-054378 A | 3/2012 |

OTHER PUBLICATIONS

Office Action dated Jan. 28, 2025, from corresponding Japan Patent Application No. 2021-184270, 10 pages.
Notice of Allowance issued in the corresponding U.S. Appl. No. 17/097,870 dated Nov. 22, 2023.
Non-Final Office Action issued in the corresponding U.S. Appl. No. 17/097,870 dated Jun. 23, 2023.

* cited by examiner

SEMICONDUCTOR CHIP, SEMICONDUCTOR DEVICE AND MANUFACTURING METHOD OF SEMICONDUCTOR DEVICE

CROSS-REFERENCE TO RELATED APPLICATIONS

This application is a Divisional of U.S. patent application Ser. No. 17/097,870, filed Nov. 13, 2020, and is incorporated herein by reference in its entirety.

BACKGROUND

The present disclosure relates to a semiconductor chip, a semiconductor device, and a manufacturing method of the semiconductor device.

There is a disclosed technique listed below.
[Patent Document 1] Japanese Unexamined Patent Application Publication No. 2012-54378

For Electro-Static Discharge (ESD) countermeasure, as shown in Patent Document 1, a semiconductor device in which a power device with a gate protection element is mounted is known. In Patent Document 1, a gate electrode, and a source electrode of a Metal Oxide Semiconductor Field Effect Transistor (MOSFET), and a gate protection element are formed in a semiconductor chip. One end and the other end of the gate protection element are connected to the gate electrode and the source electrode through a connection via, respectively.

SUMMARY

For example, a MOSFET or an Insulated Gate Bipolar Transistor (IGBT) is known as a power device. As shown in Patent Document 1, the semiconductor chip on which such a power device is mounted may include a gate protection element. On the other hand, in a power device, it is usually required to detect an abnormality in the gate insulating film prior to product shipment. Thus, for example, at the time of testing prior to product shipment, a voltage is applied between the gate of the power device and the source or emitter, the magnitude of the leakage current flowing in response to the applied voltage is measured.

However, in a semiconductor chip in which a power device with a gate protection element is mounted, the gate protection element is connected between the gate of the power device and the source or the emitter of the power device. Therefore, there is a risk that the leakage current flowing through the gate insulating film of the power device cannot be measured with high accuracy due to the current flowing through the gate protection element. That is, there is a risk that an abnormality of the gate insulating film cannot be detected with high accuracy.

Other objects and new features will be apparent from the description of this specification and the accompanying drawings.

Therefore, a semiconductor chip according to one embodiment is a semiconductor chip in which a power device which is an IGBT or a MOSFET is formed. The semiconductor chip includes a first electrode connected to a gate of the power device, a second electrode connected to an emitter or a source of the power device, a third electrode, and a gate protection element. The gate protection element includes a first node and a second node, and a plurality of stages of p-n junctions formed between the first node and the second node. When one of the first electrode and the second electrode is a target electrode and the other is a non-target electrode, the first node is connected to the third electrode and the second node is connected to the target electrode. Then, the first electrode, the second electrode, the third electrode and the gate protection element are formed in the same semiconductor chip.

By using the semiconductor chip according to one embodiment, it is possible to detect an abnormality of the gate insulating film with high accuracy.

DETAILED DESCRIPTION

Figure 1A:
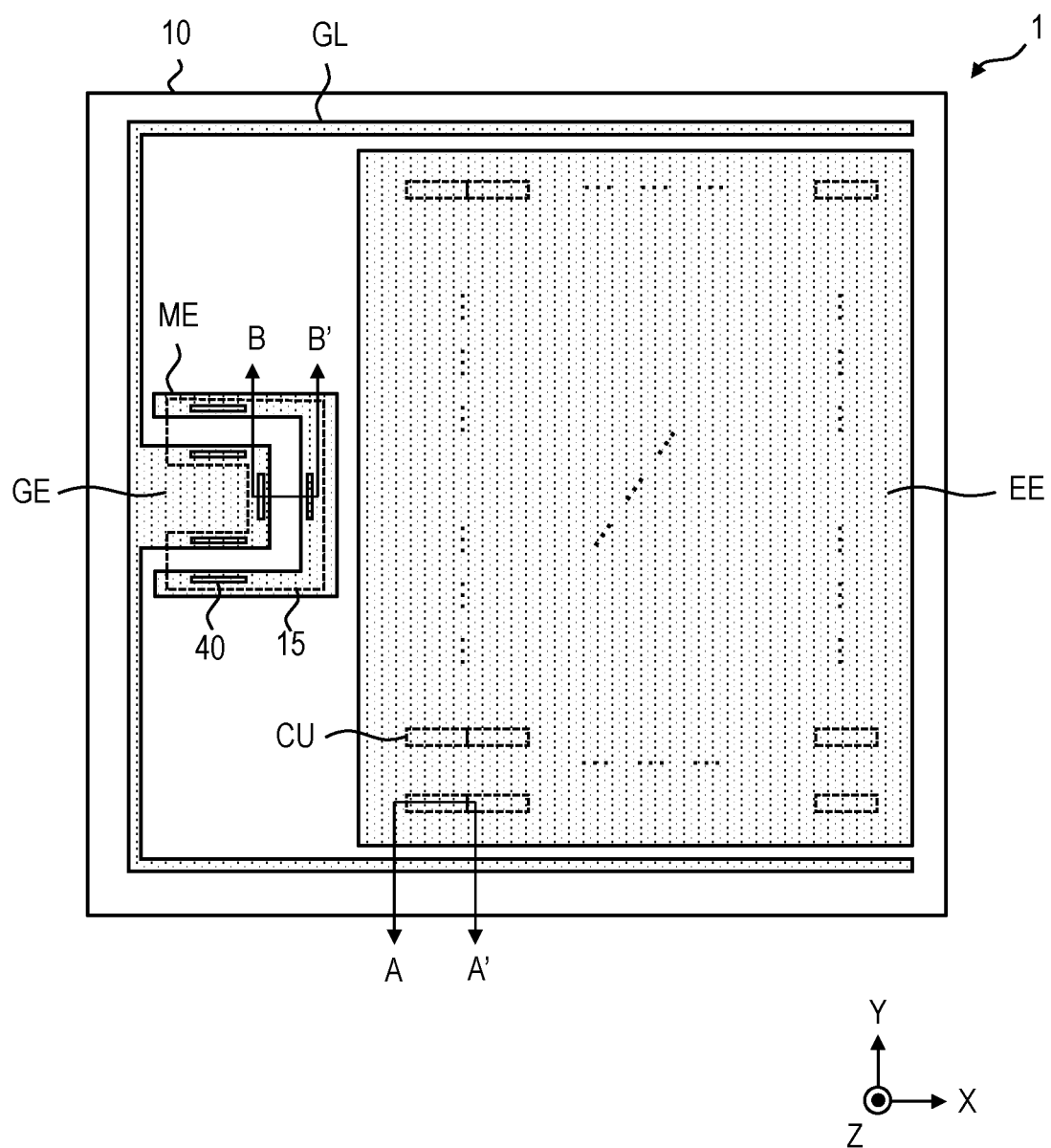
FIG. 1A is a plan view showing an example of a schematic configuration of a main part of a semiconductor device according to a first embodiment of the present disclosure.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail with reference to the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

First Embodiment

Configuration of Semiconductor Device

Figure 1B:
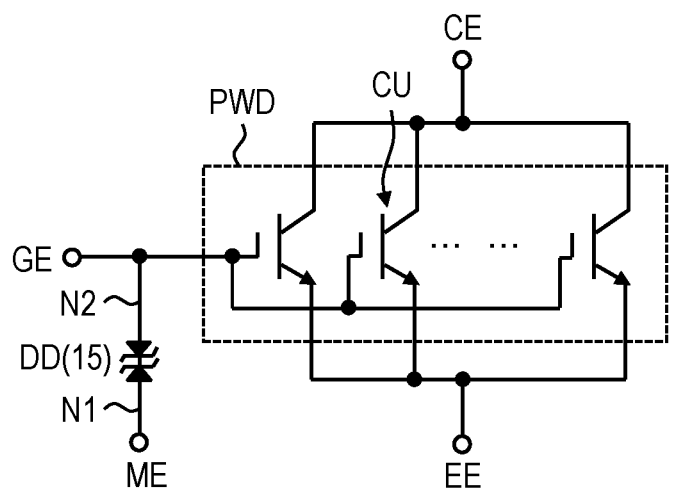
FIG. 1B is a diagram showing an example of an equivalent circuit of the semiconductor device in FIG. 1A.

FIG. 1A is a plan view showing an example of a schematic configuration of a main part of a semiconductor device according to a first embodiment of the present disclosure. FIG. 1B is a diagram showing an example of an equivalent circuit of the semiconductor device in FIG. 1A. The semiconductor device 1 shown in FIG. 1A includes one semiconductor chip 10 in which a power device is formed. The power device may be an IGBT or a MOSFET. In the specification, as shown in FIG. 1B, the case where the power device PWD is an IGBT is mainly taken as an example.

The semiconductor chip 10 shown in FIG. 1A, in the main surface, includes an intermediate electrode (third electrode) ME, in addition to a gate electrode (first electrode) GE, a gate wiring GL extending from the gate electrode GE, and an emitter electrode (second electrode) EE. Further, the semiconductor chip 10, on the back surface facing the main surface, includes a collector electrode CE. Each electrode is made of, for example, a metal material typified by aluminum or the like. The gate electrode GE, the emitter electrode EE and the collector electrode CE are connected to the gate, emitter and collector of the power device PWD, respectively, as shown in FIG. 1B.

Further, the semiconductor chip 10 shown in FIG. 1A includes a protection element forming region 15. As shown in FIG. 1B, a gate protection element DD is formed in the protection element forming region 15. The gate protection element DD is, in this example, a cathode common type bidirectional Zener diode provided between two nodes N1 and N2. The bidirectional Zener diode includes a plurality of stages of p-n junctions formed between the two nodes N1 and N2. The gate protection element DD may not necessarily be limited to a bidirectional Zener diode, and may include a plurality of stages of p-n junctions. Further, the bidirectional diode may be an anode common type instead of the cathode common type.

The node N1 of the gate protection element DD is connected to the intermediate electrode ME through a contact hole 40, as shown in FIGS. 1A and 1B. On the other hand, when one of the gate electrode GE and the emitter electrode EE is a target electrode and the other is a non-target electrode, the node N2 of the gate protection element DD is connected to the target electrode through the contact hole 40. In the example of FIGS. 1A and 1B, the target electrode is the gate electrode GE, and the non-target electrode is the emitter electrode EE. Thus, by providing the intermediate electrode ME, the gate protection element DD, in the semiconductor chip 10, is not connected between the gate electrode GE and the emitter electrode EE.

As shown in FIG. 1A, for example, a plurality of unit cells CU arranged in a matrix in the X-axis direction and Y-axis direction is formed in the lower layer region of the emitter electrode EE in the semiconductor chip 10. As shown in FIG. 1B, each of the plurality of unit cells CU is the IGBT. Then, the plurality of IGBTs constitute one power device PWD as a whole by connecting each of the terminals of the IGBTs in parallel within the semiconductor chip 10. Incidentally, when the power device PWD is a MOSFET, the emitter electrode EE and the collector electrode CE, respectively, a source electrode connected to the source of the MOSFET, and a drain electrode connected to the drain of the MOSFET.

Details of Unit Cell and Gate Protection Element

Figure 2:
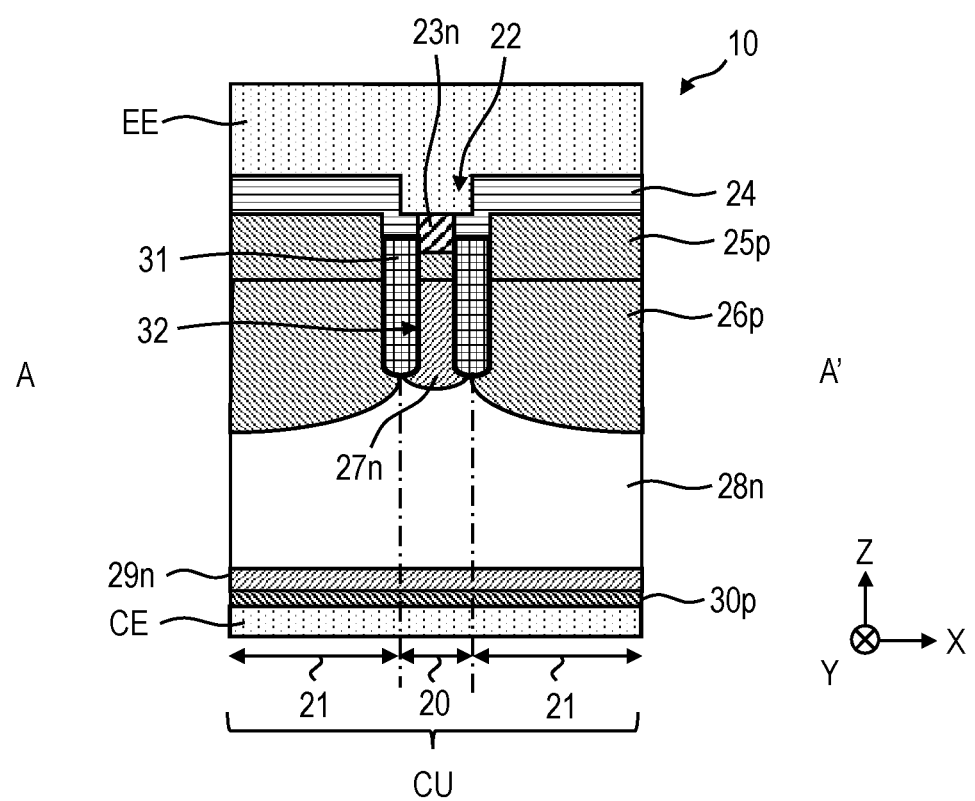
FIG. 2 is a cross-sectional view showing an example of a configuration between A-A' in FIG. 1A.

FIG. 2 is a cross-sectional view showing an example of a configuration between A-A' in FIG. 1A. FIG. 2 shows an example of a configuration of the unit cell CU in FIGS. 1A and 1B. In FIG. 2, the collector electrode CE is formed on the back surface of the semiconductor chip 10. The emitter electrode EE is formed on the main surface of the semiconductor chip 10. Further, on the main surface side of the semiconductor chip 10, two trench gate layers 31 are formed side by side in the X-axis direction. The gate insulating film 32 is formed on the surfaces of the two trench gate layers 31. The trench gate layer 31 is connected to the gate wiring GL shown in FIG. 1A.

The unit cell CU in the semiconductor chip 10 is divided into an active region 20 and an inactive region 21. The active region 20, in the X-axis direction, is a region sandwiched between the two trench gate layers 31, and the region where an emitter current flows. On the other hand, the inactive regions 21, in the X-axis direction, are regions provided on both sides of the active region 20. As shown in FIG. 1, by arranging such a unit cell CU side by side in the X-axis direction, the active region 20, in the X-axis direction, will be disposed at a certain interval.

In the active region 20, an N+ type emitter layer 23n, a P type body layer 25p, an N type hall barrier layer 27n, an N− type drift layer 28n, an N type field stop layer 29n, and a P+ type collector layer 30p are formed in this order from the emitter electrode EE to the collector electrode CE. On the other hand, in the inactive region 21, an interlayer insulating film 24, the body layer 25p, a P type floating layer 26p, the N− type drift layer 28n, the N type field stop layer 29n, and the P+ type collector layer 30p are formed in this order from the emitter electrode EE to the collector electrode CE. A contact hole 22 is formed in the interlayer insulating film 24, the emitter layer 23n is formed in the contact hole 22, and further, the emitter electrode EE is laminated.

The structure as shown in FIG. 2 is called, for example, an Injection Enhancement (IE) type trench gate IGBT or the like. That is, by providing the inactive regions 21 on both sides of the active region 20, IE effect that carriers are accumulated on the emitter side in the drift layer 28n occurs. As a result, it is possible, for example, to reduce an on-voltage between the emitter and the collector. In the Y-axis direction of FIG. 1A, in a region between the neighboring unit cells CU, instead of the N+ type emitter layer 23n in FIG. 2, a P type body contact layer that connects the P type body layer 25p to the emitter electrodes EE is provided.

Figure 3:
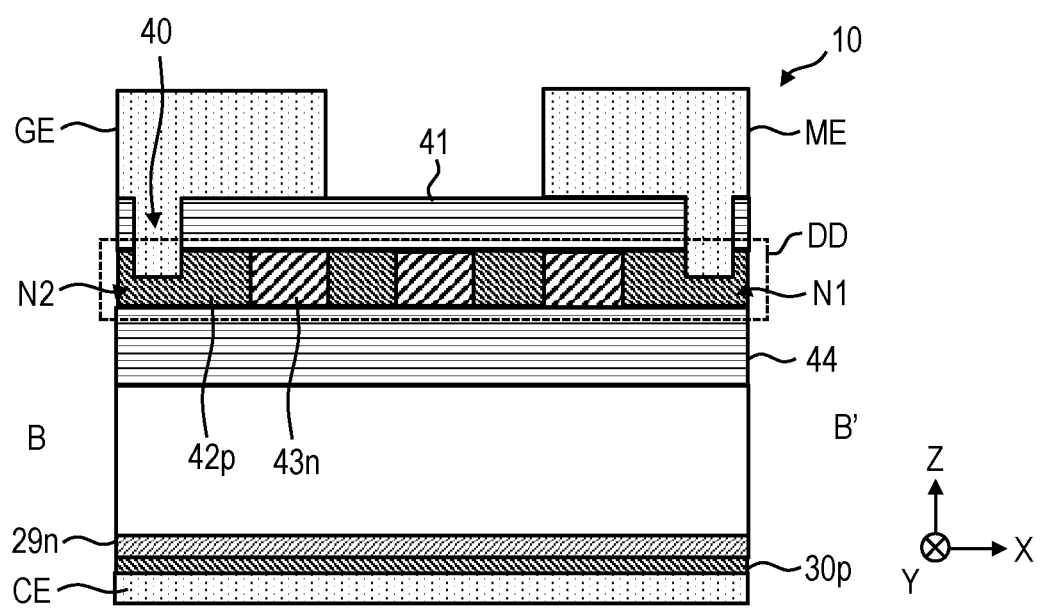
FIG. 3 is a cross-sectional view showing an example of a configuration between B-B' in FIG. 1A.

FIG. 3 is a cross-sectional view showing an example of a configuration between B-B' in FIG. 1A. FIG. 3 shows an example of a configuration of the gate protection element DD of FIG. 1B formed in the protection element forming region 15 of FIG. 1A. In FIG. 3, a field insulating film 44 is formed in the main surface side of the semiconductor chip 10. The gate protection element DD is formed on the field insulating film 44. The gate protection element DD includes the two nodes N1 and N2, P+ type semiconductor layers 42p and N+ type semiconductor layer 43n which are alternately arranged in the X-axis direction between the two nodes N1 and N2.

Thus, the gate protection element DD is, in this example, a bidirectional Zener diode including a plurality of stages of p-n junctions formed between the two nodes N1 and N2. The number of stages of the p-n junctions is an even number, and accordingly, the two nodes N1 and N2 are configured by semiconductor layers of the same conductive type. In the example of FIG. 3, the number of stages of the p-n junction is six, and the two nodes N1 and N2 are the P+ type semiconductor layers 42p.

An interlayer insulating film 41 is formed on the gate protection element DD. The two contact holes 40 are formed in the interlayer insulating film 41 so as to reach the two nodes N1 and N2 of the gate protection element DD. Further, the intermediate electrode ME is formed on the upper layer of the node N1, and the gate electrode GE is formed on the upper layer of the node N2. As a result, the node N1 of the gate protection element DD is connected to the intermediate electrode ME through the contact hole 40, and the node N2 of the gate protection element DD is connected to the gate electrode GE through the contact hole 40. The configuration of the back surface side of the semiconductor chip 10 in FIG. 3 is the same as the example of the configuration of FIG. 2.

Incidentally, when the anode common type rather than the cathode common type is used as the bidirectional Zener diode constituting the gate protection element DD, the conductive types of the semiconductor layers 42p and 43n in FIG. 3 may be replaced with each other. Also, when the MOSFET rather than the IGBT is used as the unit cell CU, the emitter electrode EE, the emitter layer 23n and the collector electrode CE of FIG. 2, respectively, are replaced with the source electrode, the source layer and the drain electrode. Further, in this case, for example, the inactive region 21, the collector layer 30p, and the hole barrier layer 27n are not necessary, and the field stop layer 29n is configured to be an N+ type drain layer.

Manufacturing Method of Semiconductor Device

Figure 4:
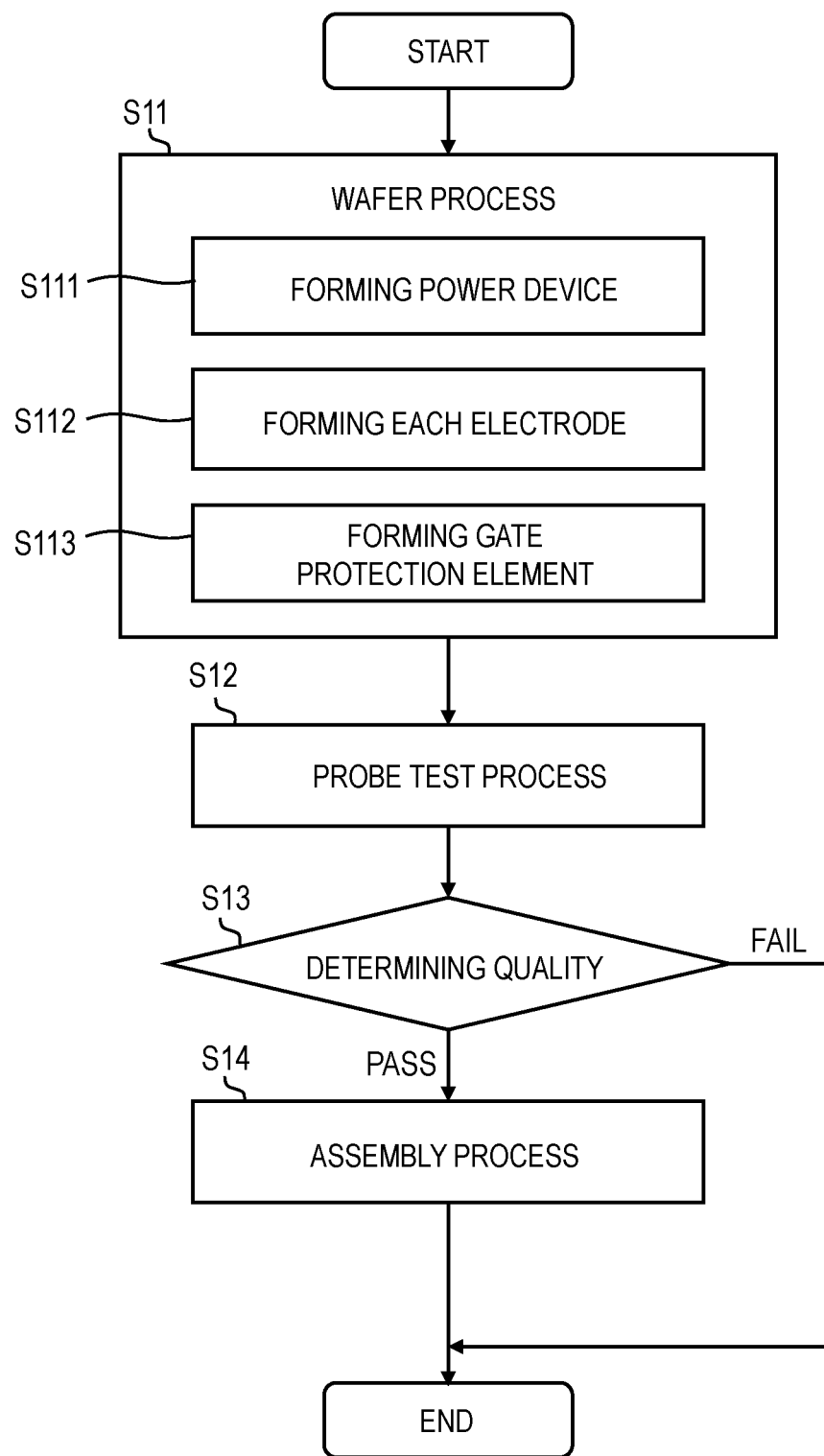
FIG. 4 is a flowchart showing an example of main processes in a manufacturing method of the semiconductor device according to the first embodiment of the present disclosure.

FIG. 4 is a flowchart showing an example of main processes in a manufacturing method of the semiconductor device according to the first embodiment of the present disclosure. In FIG. 4, at first, a predetermined semiconductor manufacturing apparatus performs a wafer process in a step S11. The wafer process in the step S11 includes a process of forming the power device PWD (step S111), a process of forming each electrode (step S112), and a process of forming the gate protection element DD (step S113).

In the step S111, for example, a plurality of semiconductor chips 10 including the unit cell CU in which the emitter electrode EE is removed from FIG. 2 is formed on a semiconductor wafer. In the step S112, the gate electrode GE, the intermediate electrode ME, the emitter electrode EE, and the like as shown in FIGS. 2 and 3 are formed. In the step S113, the gate protection element DD as shown in FIG. 3 is formed. Incidentally, strictly, after the gate protection element DD is formed in the step S113, the gate electrode GE and the intermediate electrode ME is formed in step S112, so as to connect to the gate protection element DD through the contact hole 40.

Subsequently, in a step S12, a probe inspection apparatus performs a probe test for the semiconductor wafer on which the wafer process of the step S11 has been performed. Next, in a step S13, the probe inspection apparatus or the like determines a quality for each semiconductor chip 10 in the semiconductor wafer based on the result of the probe test. Then, in a step S14, a predetermined assembly apparatus performs assembly to a package for the semiconductor chip 10 which is determined to be a non-defective in the step S13. After that, a test or the like for the assembled semiconductor device is performed.

Details of Probe Test Process

Figure 5A:
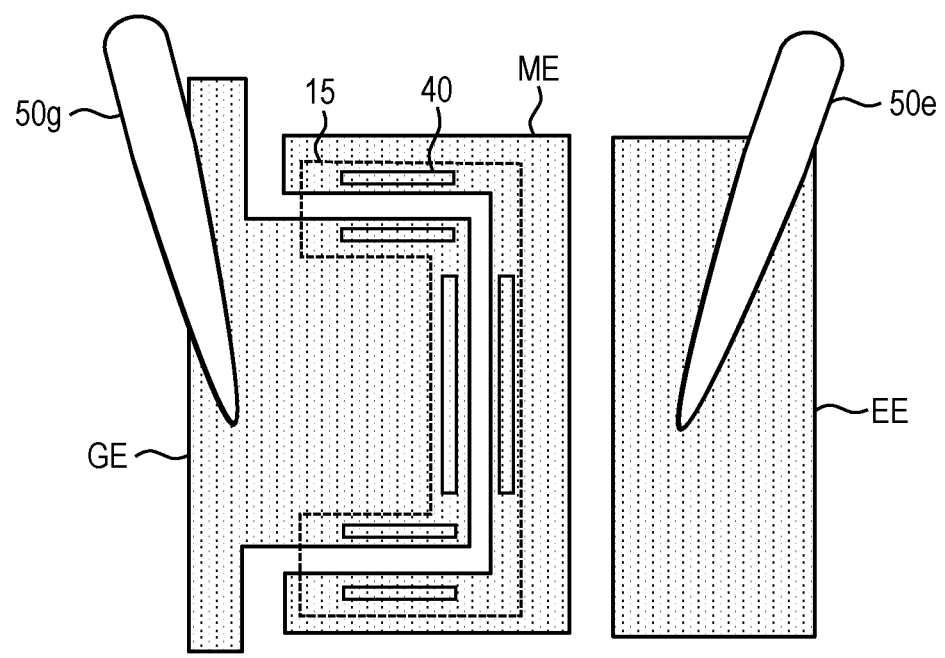
FIG. 5A is a diagram explaining an example of a probe test process in FIG. 4.
Figure 5B:
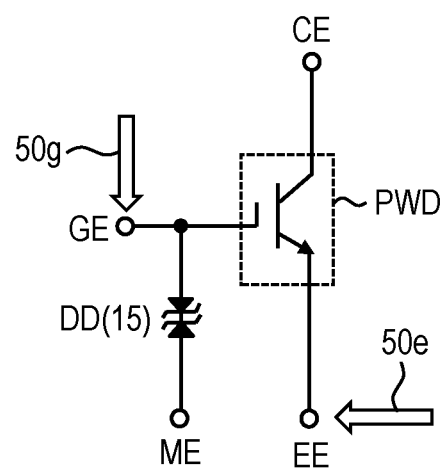
FIG. 5B is a supplementary diagram of FIG. 5A.

FIG. 5A is a diagram explaining an example of a probe test process in FIG. 4, and FIG. 5B is a supplementary diagram of FIG. 5A. In FIG. 5A, an example of a configuration in which the periphery of the protection element forming area 15 in FIG. 1A is extracted is shown. In FIG. 5B, an example of an equivalent circuit at the time of testing in FIG. 5A is shown. In the step S12 of FIG. 4, as shown in FIGS. 5A and FIG. 5B, a state in which a probe 50g is in contact with the gate electrode GE and a probe 50e is in contact with the emitter electrode EE is constructed. Then, the probe inspection apparatus applies a voltage between the gate electrode GE and the emitter electrode EE through the probes 50g and 50e and measures a current.

Here, in the semiconductor device serving as a comparative example as shown in Patent Document 1, the intermediate electrode ME, for example, in FIGS. 1A and 1B, is not provided, and the gate protection element DD between the gate electrode GE and the emitter electrode EE is configured to be connected. In this case, when a voltage is applied between the gate electrode GE and the emitter electrode EE, a reverse current flows to the p-n junction included in the gate protection element DD. The probe inspection apparatus measures the combined current of the reverse current and the leakage current between the gate and the emitter caused by the abnormality of the gate insulating film 32 of FIG. 2.

Consequently, in the semiconductor device as the comparative example, there is a possibility that the abnormality of the gate insulating film 32 cannot be detected with high accuracy. For example, under normal conditions, the reverse current may be in the order of $\mu A$, and the leakage current of the gate insulating film 32 may be in the order of pA-nA. In this case, for example, even if the leakage current of the gate insulating film 32 is slightly increased due to a slight abnormality, the leakage current may be buried in the reverse current, and the increase in the leakage current may not be detected. Incidentally, examples of the abnormality of the gate insulating film 32 include contamination of foreign matter and local thinness of the film thickness.

On the other hand, in the semiconductor device 1 according to the first embodiment, by providing the intermediate electrode ME, the gate protection element DD is not connected between the gate electrode GE and the emitter electrode EE. As a result, it becomes possible to detect the abnormality of the gate insulating film 32 with high accuracy. For example, it is possible to detect a slight abnormality occurring in the gate insulating film 32. Also, in the probe test, an accelerated test may be performed, such as measuring the leakage current between the gate and the emitter after applying a voltage for acceleration test between the gate and the emitter for a certain period of time. When the semiconductor device 1 according to the first embodiment is used, for example, it becomes possible to detect an abnormality of the gate insulating film 32 that may cause a detection omission in this acceleration test.

Figure 6:
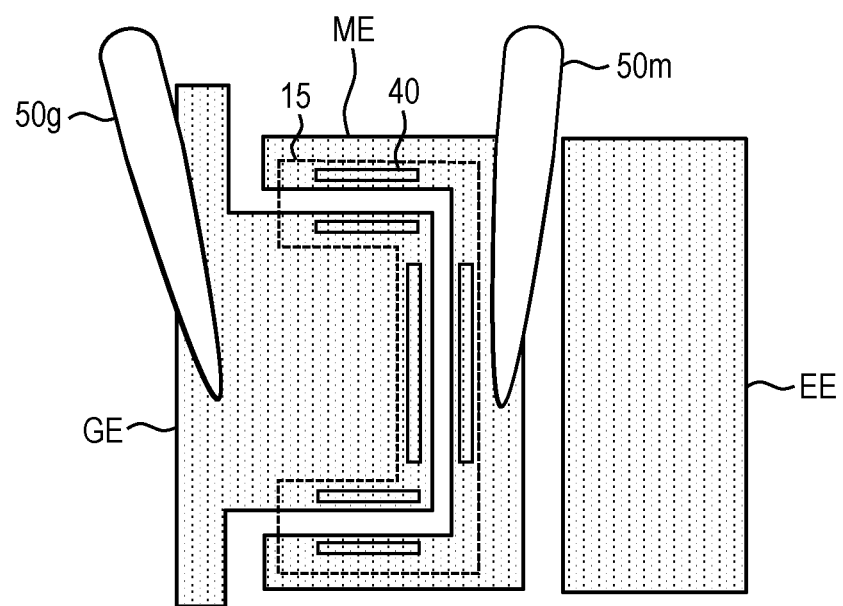
FIG. 6 is a diagram explaining an example of another probe test process in FIG. 4.

FIG. 6 is a diagram explaining an example of another probe test process in FIG. 4. In FIG. 6, a state in which the probe 50g is in contact with the gate electrode GE which is the target electrode, and a probe 50m is in contact with the intermediate electrode ME is constructed. The probe inspection apparatus applies a voltage between the gate electrode GE which is the target electrode and the intermediate electrode ME through the probes 50g and 50m and measures a current. Thus, for example, an abnormality of the gate protection element DD typified by an open defect or the like in the contact hole 40 of FIG. 3 is detectable.

Details of Assembly Process

Figure 7:
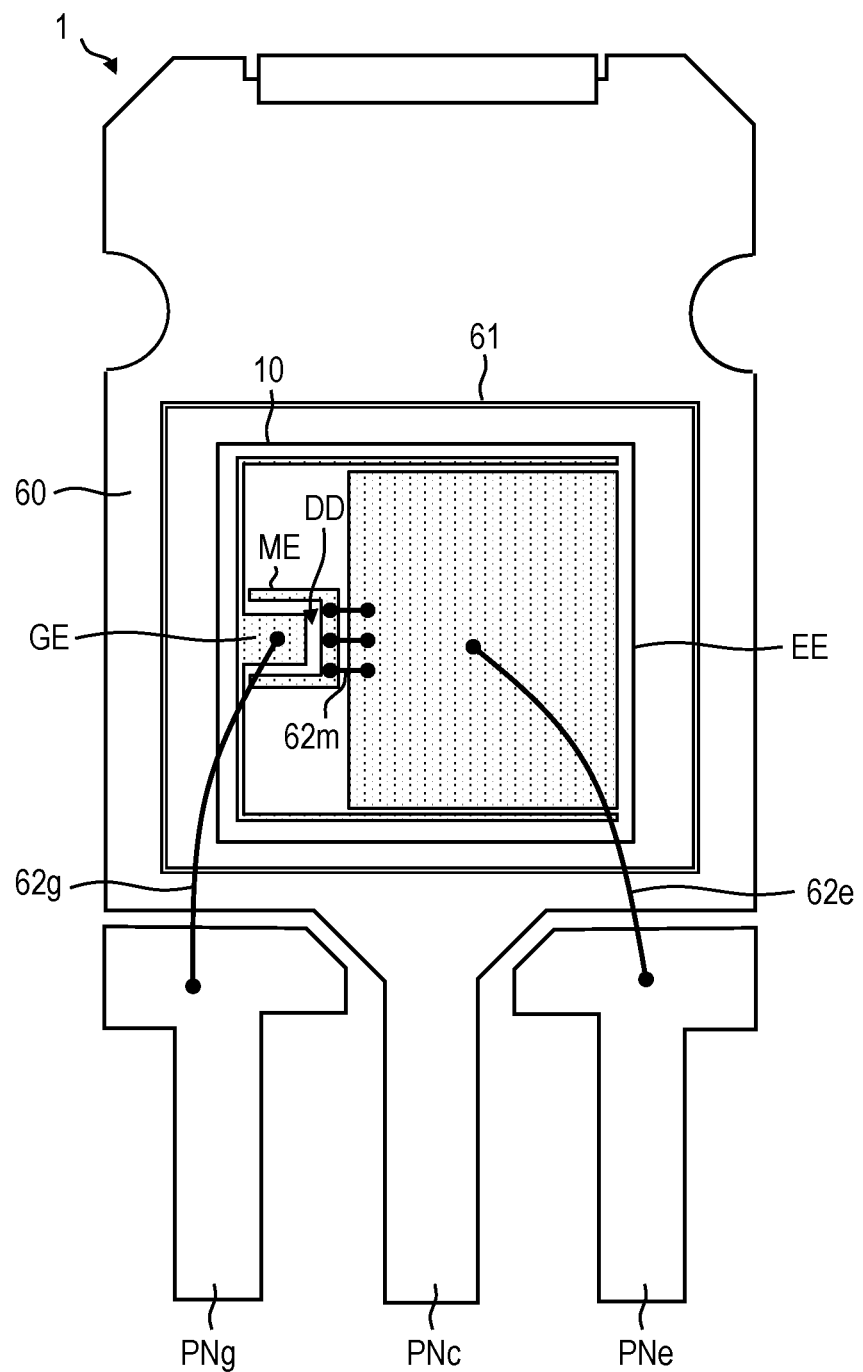
FIG. 7 is a diagram explaining an example of an assembly process in FIG. 4.

FIG. 7 is a diagram explaining an example of an assembly process in FIG. 4. In FIG. 7, an example of a configuration of the semiconductor device 1 after the semiconductor chip 10 is assembled into a package is shown. The semiconductor device 1 shown in FIG. 7 includes a die pad 60 which is a part of the package for sealing the semiconductor chip 10, three external terminals PNg, PNc, and PNe which are external terminals of the package, and metallic wiring members 62g, 62m, and 62e, in addition to the semiconductor chip 10. The wiring members 62g, 62m, and 62e are typically bonding wires, plate members, or the like.

The external terminal (first external terminal) PNg is a lead for the gate, and the external terminal (second external terminal) PNe is a lead for the emitter. The external terminal PNc is a lead for the collector, and has a configuration connected to the die pad 60. A region surrounded by, for example, a V-shaped groove 61 is formed in the die pad 60, the semiconductor chip 10 is mounted in this region via a metal paste material.

The wiring member (first wiring member) 62g connects the gate electrode GE and the external terminal PNg. The wiring member (second wiring member) 62e connects the emitter electrode EE and the external terminal PNe. The wiring member (third wiring member) 62m connects the intermediate electrode ME and the emitter electrode EE which is the non-target electrode. In the assembled semiconductor device 1, the gate protection element DD is, by the wiring member 62m, connected between the external terminal PNg which is the lead for the gate and the external terminal PNe which is the lead for the emitter. In the assembly process (step S14) of FIG. 4, the predetermined assembly apparatus assembles the semiconductor chip 10 into, for example, a package as shown in FIG. 7.

Modification of Assembly

In FIG. 7, the wiring member 62m for connecting the intermediate electrode ME and the emitter electrode EE is provided, but the semiconductor device 1 of FIG. 7 may be configured so that the wiring member 62m is not provided. In this case, the intermediate electrode ME is electrically open to the emitter electrode EE which is the non-target electrode. For example, the gate protection element DD may not be required depending on what kind of circuit the power device PWD is incorporated into. Or, without using the gate protection element DD incorporated in the semiconductor chip 10, a gate protection element may be separately provided as an external component of the assembled semiconductor device 1. In such a case, a configuration in which the wiring member 62m is not provided may be used.

That is, by using the same semiconductor chip 10 and selecting whether to provide the wiring member 62m, substantially, it becomes possible to realize the semiconductor device 1 incorporating the gate protection element DD and the semiconductor device 1 not incorporating the gate protection element DD. Thus, by realizing the two types of the semiconductor device 1 on sharing the semiconductor chip 10, for example, it is possible to reduce the cost.

Main Effects of First Embodiment

As described above, by using the method of the first embodiment, typically, an abnormality of the gate insulating film 32 can be detected with high accuracy. Consequently, the reliability of the semiconductor device 1 is enhanced. Further, for example, in order to be able to detect the abnormality of the gate insulating film 32 with high accuracy, it is also conceivable to use a semiconductor device that does not incorporate the gate protection element DD. In this case, in order to ensure an ESD breakdown voltage to some extent, for example, it may be necessary to take measures such as increasing the size of the semiconductor chip. On the other hand, by using the method of the first embodiment, since the abnormality of the gate insulating film 32 can be detected with high accuracy while incorporating the gate protection element DD, it is possible to contribute to miniaturization of the semiconductor chip.

Second Embodiment

Configuration of Semiconductor Device

Figure 8A:
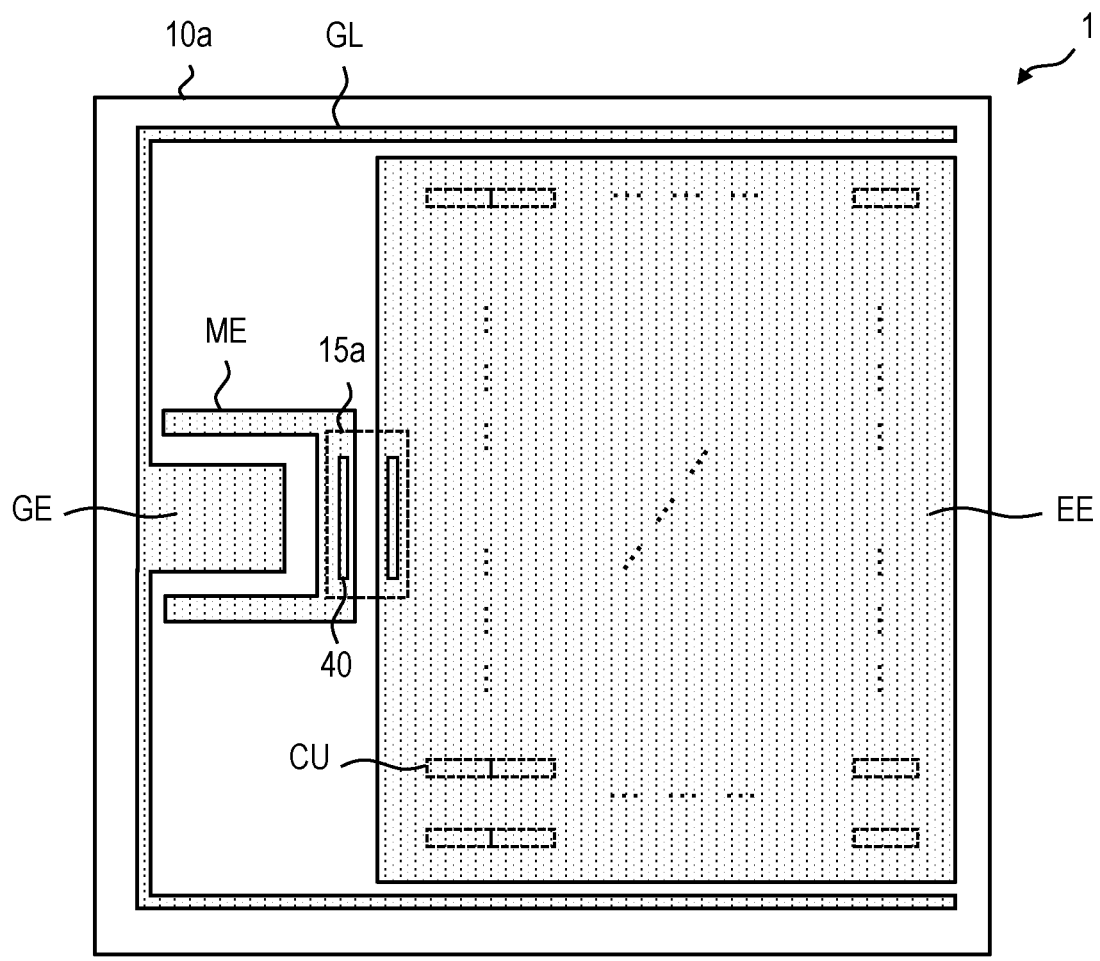
FIG. 8A is a plan view showing an example of a schematic configuration of a main part of a semiconductor device according to a second embodiment of the present disclosure.
Figure 8B:
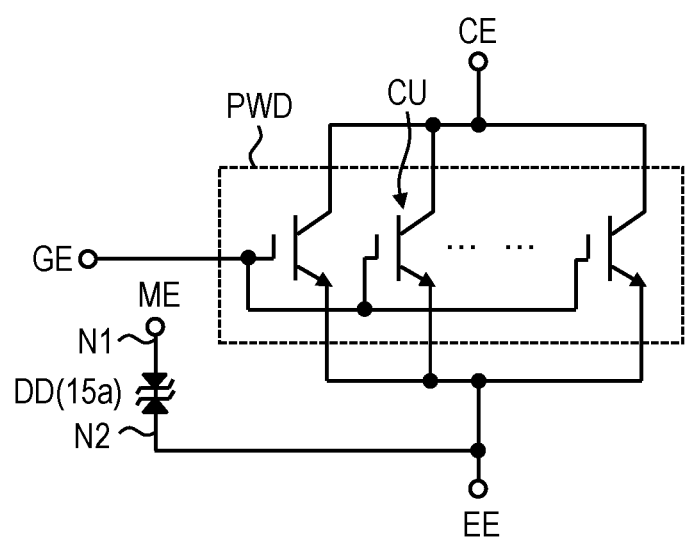
FIG. 8B is a diagram showing an example of an equivalent circuit of the semiconductor device in FIG. 8A.

FIG. 8A is a plan view showing an example of a schematic configuration of a main part of a semiconductor device according to a second embodiment of the present disclosure. FIG. 8B is a diagram showing an example of an equivalent circuit of the semiconductor device in FIG. 8A. The semiconductor device 1 shown in FIG. 8A includes a semiconductor chip 10a that differs from FIG. 1A. Arrangement of a protection element forming region 15a of the semiconductor chip 10a is different from the arrangement of the protection element forming region 15 in the example of the configuration of FIG. 1A.

As shown in FIG. 8B, the same gate protection element DD as in the case of FIG. 1B is formed in the protection element forming region 15a. Further, as in the case of FIGS. 1A and 1B, the node N1 of the gate protection element DD is connected to the intermediate electrode ME through the contact hole 40, and the node N2 of the gate protection element DD is connected to the target electrode through the contact hole 40. However, in FIGS. 8A and 8B, contrary to the case of FIGS. 1A and 1B, the target electrode is the emitter electrode EE and the non-target electrode is the gate electrode GE.

When assembling such a semiconductor chip 10a, for example, the wiring member (third wiring member) 62m in FIG. 7 connects the intermediate electrode ME and the gate electrode GE which is the non-target electrode. In addition, as described above, when using a configuration that does not provide the wiring member 62m, the intermediate electrode ME is electrically open to the gate electrode GE which is the non-target electrode. Further, with respect to the probe test process (step S12) of FIG. 4, in FIG. 6, a voltage is applied between the intermediate electrode ME and the emitter electrode EE which is the target electrode.

Main Effects of Second Embodiment

As described above, even by using the method of the second embodiment, the same effects as the various effects described in the first embodiment can be obtained. It may be determined whether any method of the first embodiment or the second embodiment is used based on, for example, the ease of layout of the semiconductor chip, the ease of securing the area required for the protection element forming region, the ease of wiring using the wiring member 62*m* as shown in FIG. 7, or the like.

Third Embodiment

Configuration of Semiconductor Device

Figure 9:
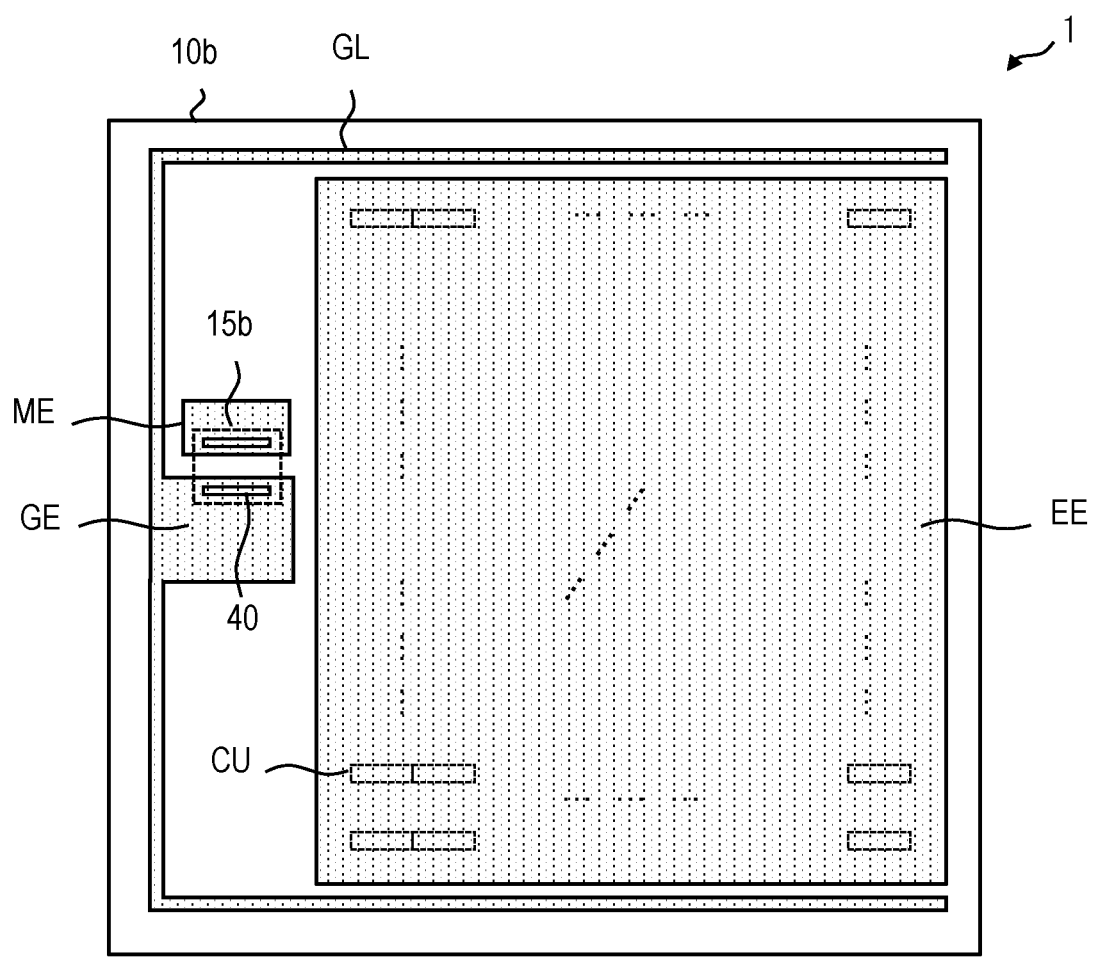
FIG. 9 is a plan view showing an example of a schematic configuration of a main portion of a semiconductor device according to a third embodiment of the present disclosure.
Figure 10:
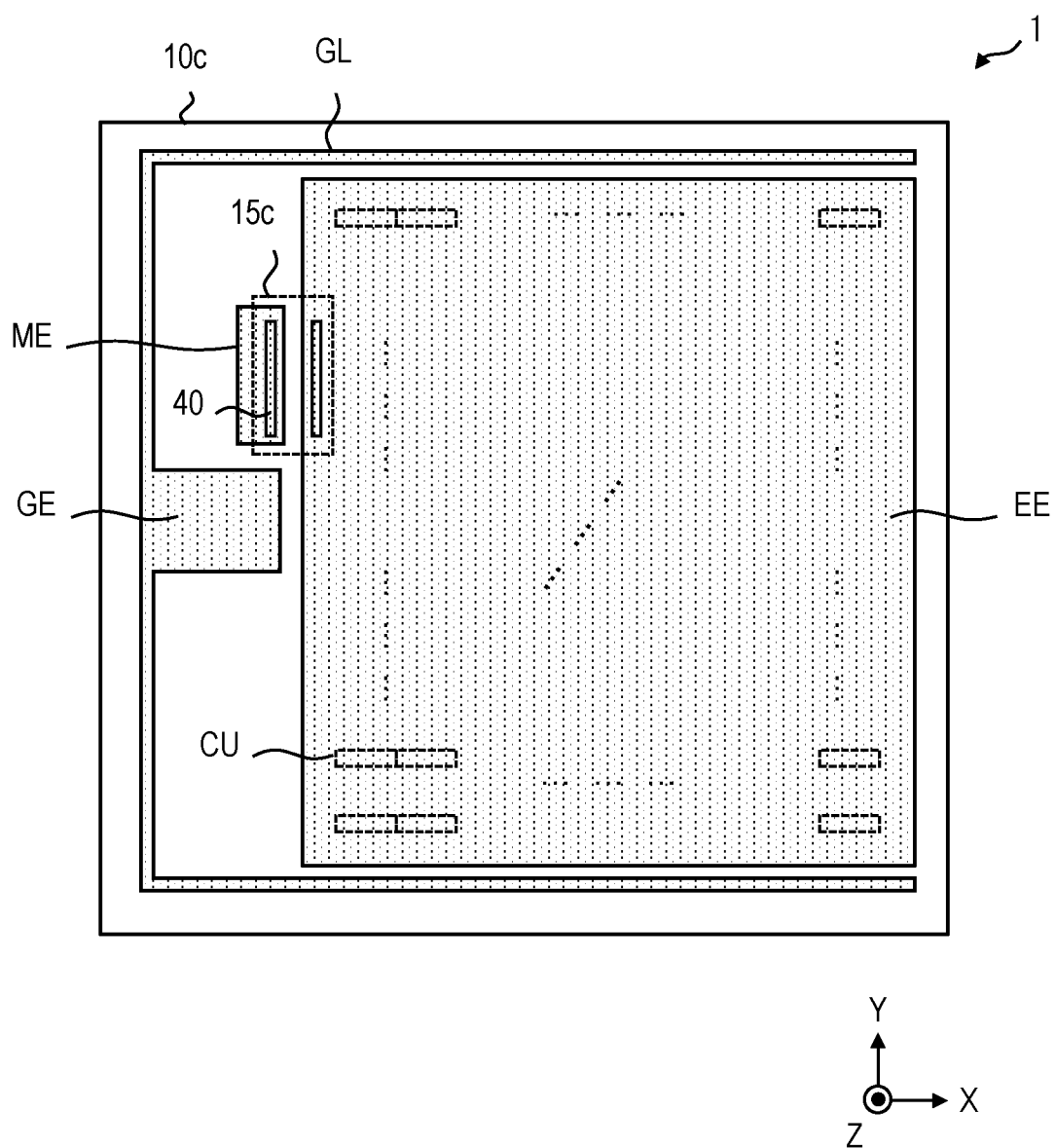
FIG. 10 is a plan view showing an example of a schematic configuration of a main part of a semiconductor device that differs from FIG. 9.

FIG. 9 is a plan view showing an example of a schematic configuration of a main portion of a semiconductor device according to a third embodiment of the present disclosure. FIG. 10 is a plan view showing an example of a schematic configuration of a main part of a semiconductor device that differs from FIG. 9. The arrangement of the intermediate electrode ME is not limited to the arrangement shown in FIG. 1A or 8A, and can be appropriately changed as shown in FIG. 9 or 10. For example, in the arrangement example of FIG. 1A or 8A, it is necessary to secure a space for arranging the intermediate electrode ME between the gate electrode GE and the emitter electrode EE in the X-axis direction.

On the other hand, in arrangement examples of FIGS. 9 and 10, utilizing an empty area where the gate electrode GE and the emitter electrode EE are not arranged, the intermediate electrode ME is arranged in the empty region. In an example of a semiconductor chip 10*b* of FIG. 9, the intermediate electrode ME is arranged in an empty region around the gate electrode GE, and a protection element forming region 15*b* is provided between the gate electrode GE and the intermediate electrode ME. In an example of a semiconductor chip 10*c* of FIG. 10, the intermediate electrode ME is arranged in an empty area around the emitter electrode EE, and a protection element forming region 15*c* is provided between the emitter electrode EE and the intermediate electrode ME.

Thus, when there is an empty area in the semiconductor chip 10*a* or 10*b*, by arranging the intermediate electrode ME in the empty area, it is possible to increase the layout efficiency and contribute to miniaturization of the semiconductor chip 10. It should be noted that the same empty area as in FIG. 9 and the like exists in FIG. 1A and the like. However, when the arrangement example such as the shown FIG. 1A or the like is used, for example, the emitter electrode EE may be extended to the empty region, and the unit cell CU may be arranged in the lower layer of the emitter electrode EE.

Although the invention made by the present inventors has been specifically described based on the embodiment, the present invention is not limited to the embodiment described above, and it is needless to say that various modifications can be made without departing from the gist thereof.

What is claimed is:

1. A manufacturing method of a semiconductor device, comprising:
   forming a power device which is an Insulated Gate Bipolar Transistor (IGBT) or a Metal Oxide Semiconductor Field Effect Transistor (MOSFET) in a semiconductor chip;
   forming a first electrode coupled to a gate of the power device, a second electrode coupled to an emitter or a source of the power device and a third electrode in the semiconductor chip;
   when one of the first electrode and the second electrode is a target electrode and the other is a non-target electrode, forming a gate protection element including a first node coupled to the third electrode, a second node coupled to the target electrode, and a plurality of stages of p-n junctions formed between the first node and the second node;
   applying a voltage between the first electrode and the second electrode to measure a current;
   coupling a first external terminal which is an external terminal of a package sealing the semiconductor chip and the first electrode using a first wiring member; and
   coupling a second external terminal which is the external terminal of the package and the second electrode using a second wiring member,
   wherein the third electrode is electrically open to the non-target electrode.

* * * * *